United States Patent
Wang et al.

(10) Patent No.: US 8,866,182 B2
(45) Date of Patent: Oct. 21, 2014

(54) LED PACKAGE MODULE STRUCTURE

(75) Inventors: Jau-Sheng Wang, Kaohsiung (TW);
Chun-Chin Tsai, Kaohsiung (TW);
Wei-Chih Cheng, Kaohsiung (TW);
Shun-Yuan Huang, Kaohsiung (TW);
Wood-Hi Cheng, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 200 days.

(21) Appl. No.: 13/424,635

(22) Filed: Mar. 20, 2012

(65) Prior Publication Data

US 2013/0248903 A1  Sep. 26, 2013

(51) Int. Cl.
*H01L 33/50*  (2010.01)

(52) U.S. Cl.
USPC .......................................................... 257/99

(58) Field of Classification Search
USPC ....................................................... D13/180
See application file for complete search history.

(56) References Cited

U.S. PATENT DOCUMENTS

| 4,507,718 A * | 3/1985 | Bury ............................. 362/396 |
| 2009/0296390 A1* | 12/2009 | Dubord ....................... 362/240 |
| 2012/0327663 A1* | 12/2012 | Doan ........................... 362/294 |

* cited by examiner

*Primary Examiner* — Robert Carpenter
(74) *Attorney, Agent, or Firm* — Banger Shia

(57) ABSTRACT

A light emitting diode package module structure comprises a LED module received in a reflection cup, a light transmitting color conversion member disposed on an annular surface of the reflection cup, a stationary package sleeved on the reflection cup in such a manner that the press portion of the stationary package is pressed against the light transmitting color conversion member, and the stop portions of the positioning legs of the stationary package are positioned against the bottom of the reflection cup. In this way, the light transmitting color conversion member is fixed to the reflection cup by the stationary package without the use of adhesive agents, which consequently simplifies the packaging procedure and reduces the package cost.

6 Claims, 5 Drawing Sheets

LED PACKAGE MODULE STRUCTURE

BACKGROUND OF THE INVENTION

1. Field of the Invention

The present invention relates to a semiconductor, and more particularly to an LED package module structure.

2. Description of the Prior Art

LEDs (light emitting diode) have been widely used an illumination products and are normally packed with package modules. The conventional package module are mostly formed such that polymeric materials, such as resin, silica gel, are blended with yttrium aluminum garnet powders to form the color conversion layer which is then adhered to the substrate by adhesive agents. However, the polymeric materials gradually fall into disuse due to the heat resistance problem and will be gradually replaced with glass color conversion layer. It will have the problem of complicated procedure and high manufacturing cost, if the glass color conversion layer is still packed by the use of adhesive agents. Hence, the method for packaging and fixing the glass conversion layer will be the main direction of optoelectronic packaging.

The present invention has arisen to mitigate and/or obviate the afore-described disadvantages.

SUMMARY OF THE INVENTION

The primary object of the present invention is to provide a LED package module structure which is capable of simplifying the packaging procedure and reducing package cost.

To achieve the above object, a light emitting diode package module structure in accordance with the present invention comprises: a reflection cup, a LED module, a light transmitting color conversion member, and a stationary package. The reflection cup includes a bottom, a peripheral wall connected to the bottom to define a receiving chamber. The peripheral wall has an outer surface and an inner surface, and the inner surface of the peripheral wall facing the receiving chamber is a light reflection surface. Between an opening and the bottom of the reflection cup is formed an annular surface which is a shoulder portion lower than the top edge of the peripheral wall of the reflection cup, and a thickness of the reflection cup from the opening to the outer surface is D1. The light emitting diode module is received in the receiving chamber of the reflection cup. The light transmitting color conversion member is abutted against the annular surface. The stationary package includes a press portion and at least two elastic positioning legs connected to the press portion, the press portion is a hollow structure with a hole and has a thickness D2 which is measured from an outer periphery of the press portion to the hole. D2>D1. The respective positioning legs have one end connected to the press portion, another end of the respective positioning legs is formed with a stop portion, the stationary package is sleeved on the reflection cup in such a manner that the press portion is pressed against the light transmitting color conversion member, and the stop portions of the positioning legs are positioned against the bottom of the reflection cup.

DETAILED DESCRIPTION OF THE PREFERRED EMBODIMENTS

Figure 1:
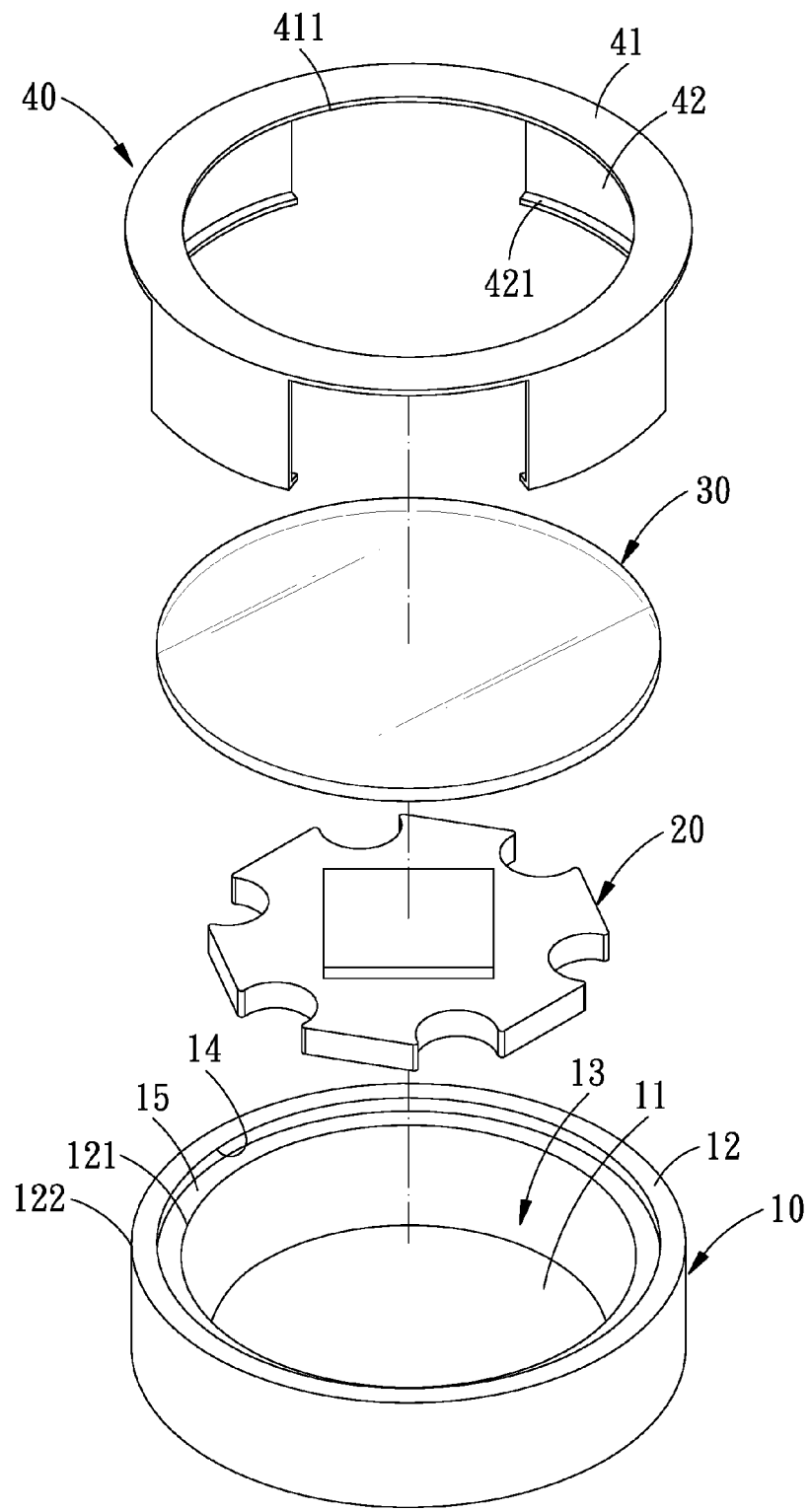
FIG. 1 is an exploded view of a LED package module structure in accordance with the present invention.

The present invention will be clearer from the following description when viewed together with the accompanying drawings, which show, for purpose of illustrations only, the preferred embodiment in accordance with the present invention.

Referring to FIGS. 1-5, a LED package module structure in accordance with the present invention comprises: a reflection cup 10, a LED module 20, a light transmitting color conversion member 30, and a stationary package 40.

The reflection cup 10 includes a bottom 11 and a peripheral wall 12 which is connected to the bottom 11 to define a receiving chamber 13. An inner surface of the peripheral wall 12 facing the receiving chamber 13 is a light reflection surface 121. An outer surface 122 of the peripheral wall 12 is a circumferential surface, and the light reflection surface 121 is a conical surface. Between an opening 14 and the bottom 11 of the reflection cup 10 is formed an annular surface 15 which is a shoulder portion lower than the peripheral wall 12, and the thickness of the reflection cup 10 from the opening 14 to the outer surface 122 is D1.

The LED module 20 is received in the receiving chamber 13 of the reflection cup 10.

The light transmitting color conversion member 30 is a coated or fluorescent glass formed to fit the shape of the annular surface 15 of the reflection cup 10 and is abutted against the annular surface 15.

Figure 2:
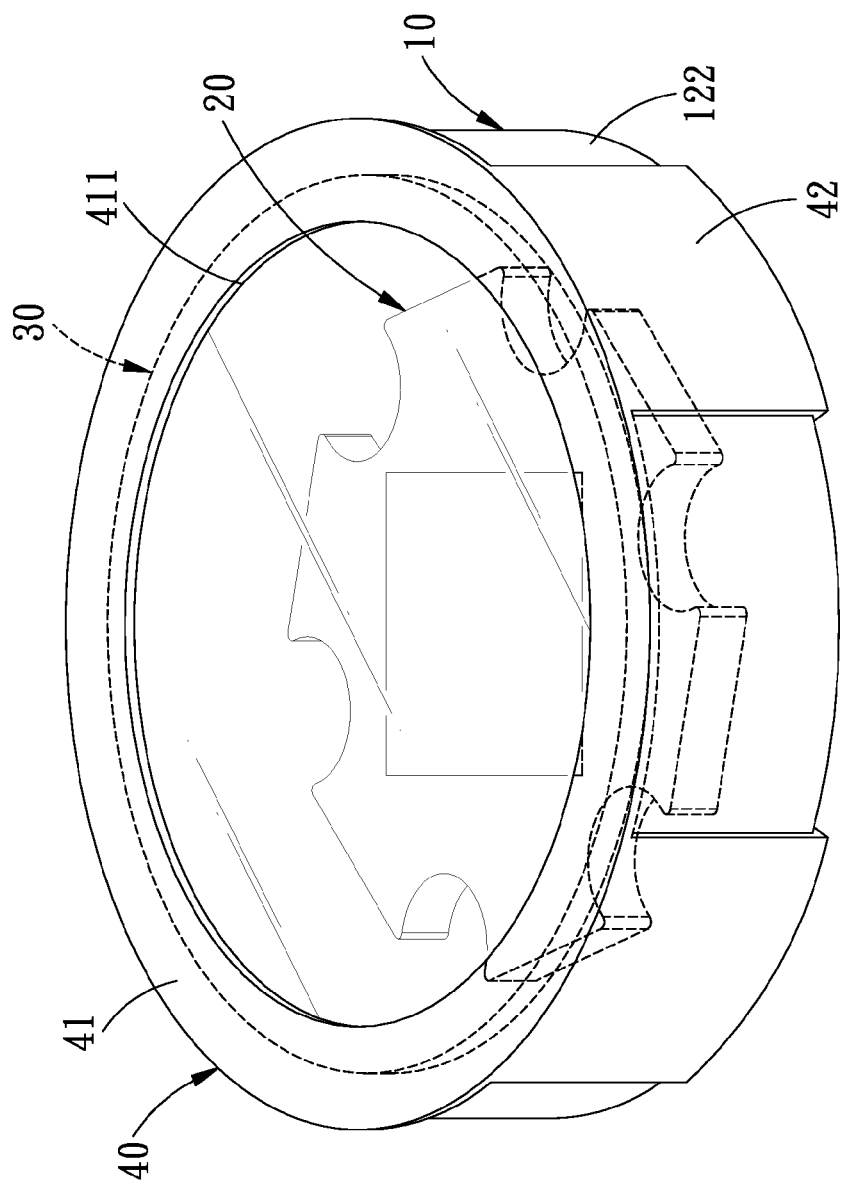
FIG. 2 is an assembly view of the LED package module structure in accordance with the present invention.
Figure 3:
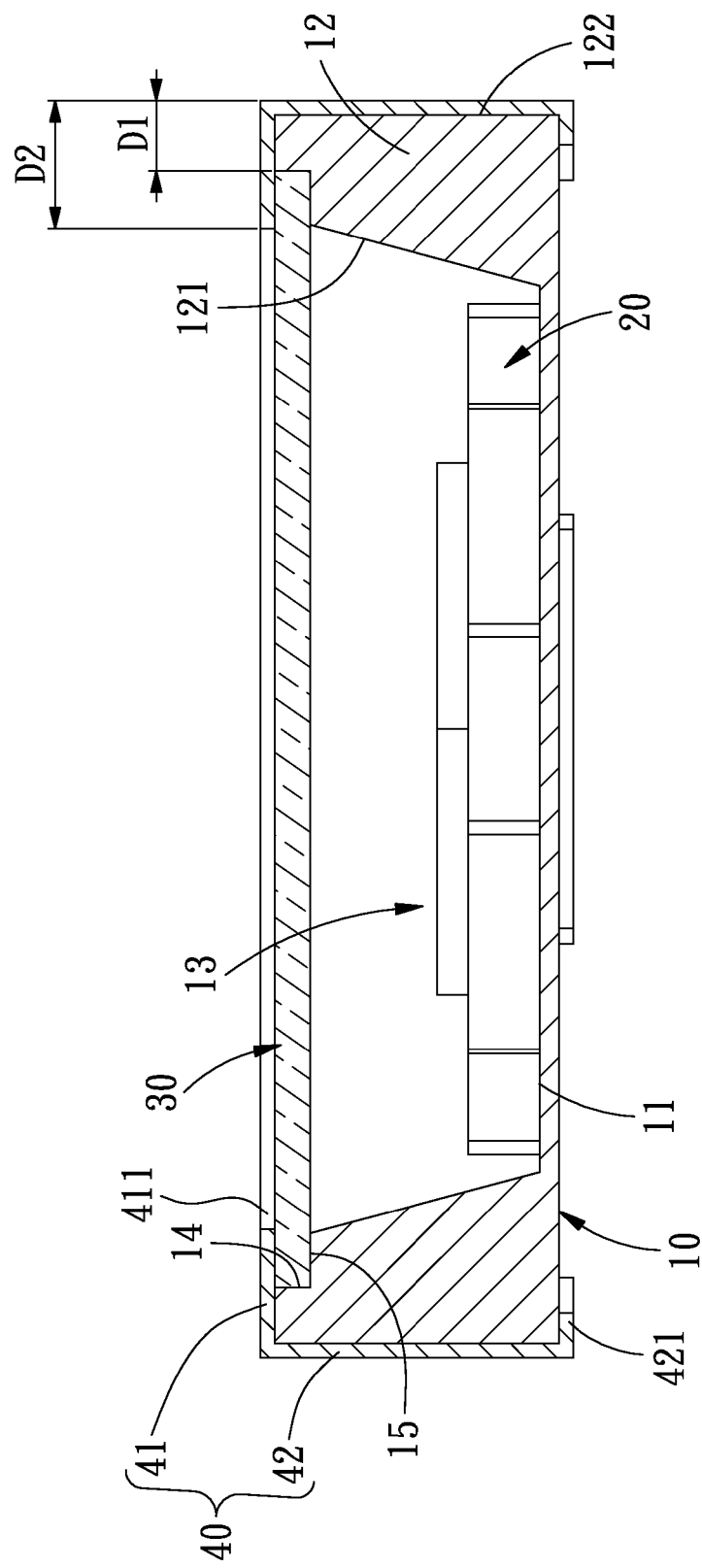
FIG. 3 is a cross sectional view of the LED package module structure in accordance with the present invention.

The stationary package 40 is made of metal or other flexible materials and includes a press portion 41 and at least two elastic positioning legs 42 connected to the press portion 41. The press portion 41 is a hollow structure with a hole 411 and has a thickness D2 which is measured from the outer periphery of the press portion 41 to the hole 411, and D2 is larger than D1. The respective positioning legs 42 have one end connected to the press portion 41 and an inner surface which is arch-shaped to fit the shape of the outer surface 122 of the reflection cup 10. Another end of the respective positioning legs 42 is formed with a stop portion 421. As shown in FIGS. 1-3, the press portion 41 is a circular structure to enable the stationary package 40 to be sleeved on the reflection cup 10 in such a manner that the press portion 41 is pressed against the light transmitting color conversion member 30, and the stop portions 421 of the positioning legs 42 are positioned against the bottom 11 of the reflection cup 10.

In assembly, the LED module 20 is firstly received in the receiving chamber 13 of the reflection cup 10, so that the light emitted from the LED module 20 can be reflected by the light reflection surface 121 of the reflection cup 10. Then the light transmitting color conversion member 30 is abutted against the annular surface 15 of the reflection cup 10, or heat sink compound can be applied between the light transmitting color conversion member 30 and the annular surface 15 to improve heat dissipation. After that, the stationary package 40 is sleeved on the reflection cup 10, and the flexible property of the stationary package 40 allows the positioning legs 42 to be slightly deformed, so that the stop portions 421 can be positioned against the bottom 11 of the reflection cup 10. When the stationary package 40 is sleeved on the reflection cup 10, the press portion 41 will press against the light transmitting color conversion member 30 which is disposed on the annular surface 15 of the reflection cup 10, so that the light transmitting color conversion member 30 is fixed to the annular surface 15 by the press portion 41 of the stationary package 40 without the use of adhesive agents, which consequently simplifies the packaging procedure and reduces the package cost.

Figure 4:
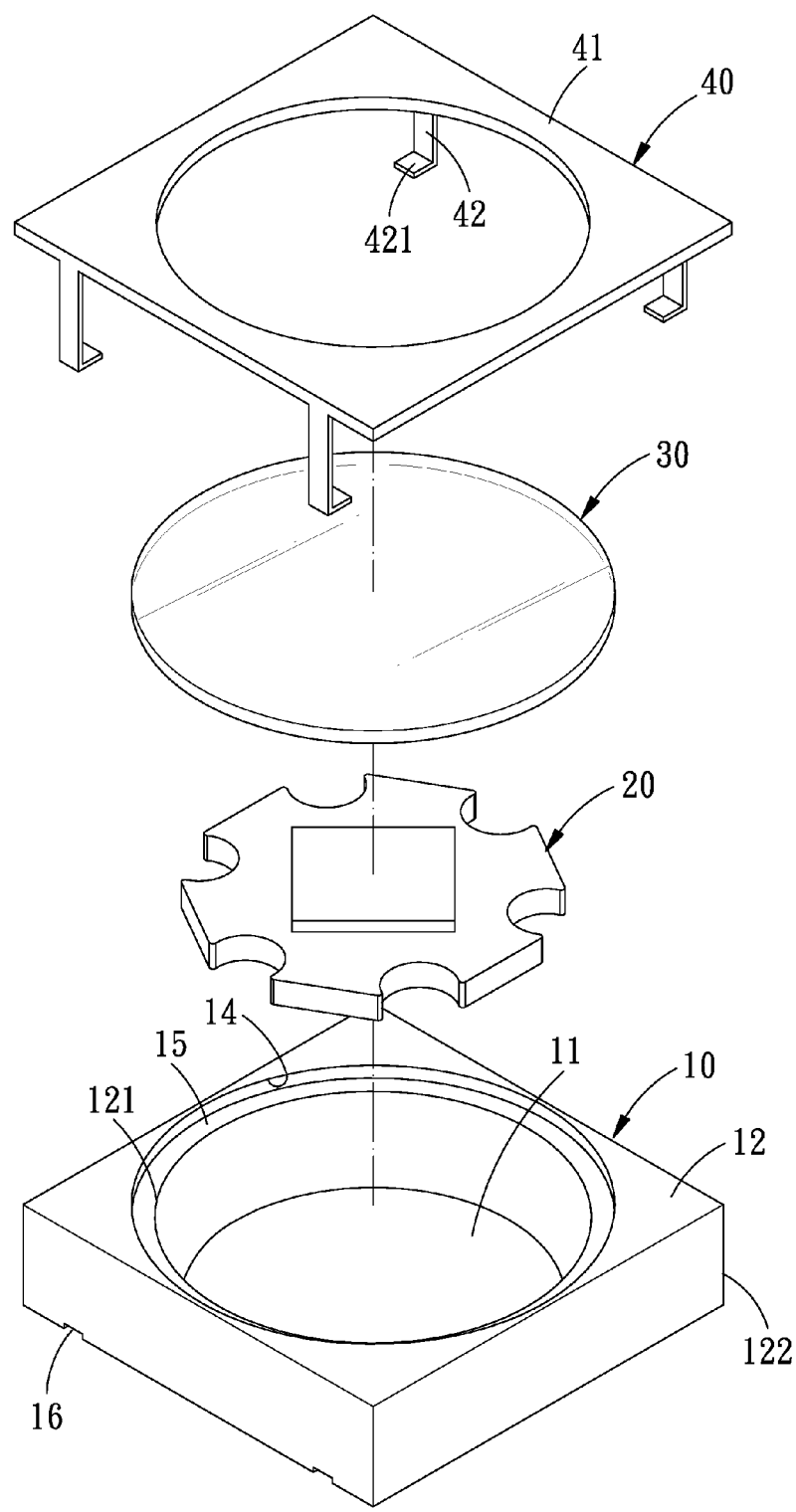
FIG. 4 is an exploded view of a LED package module structure in accordance with another embodiment of the present invention.
Figure 5:
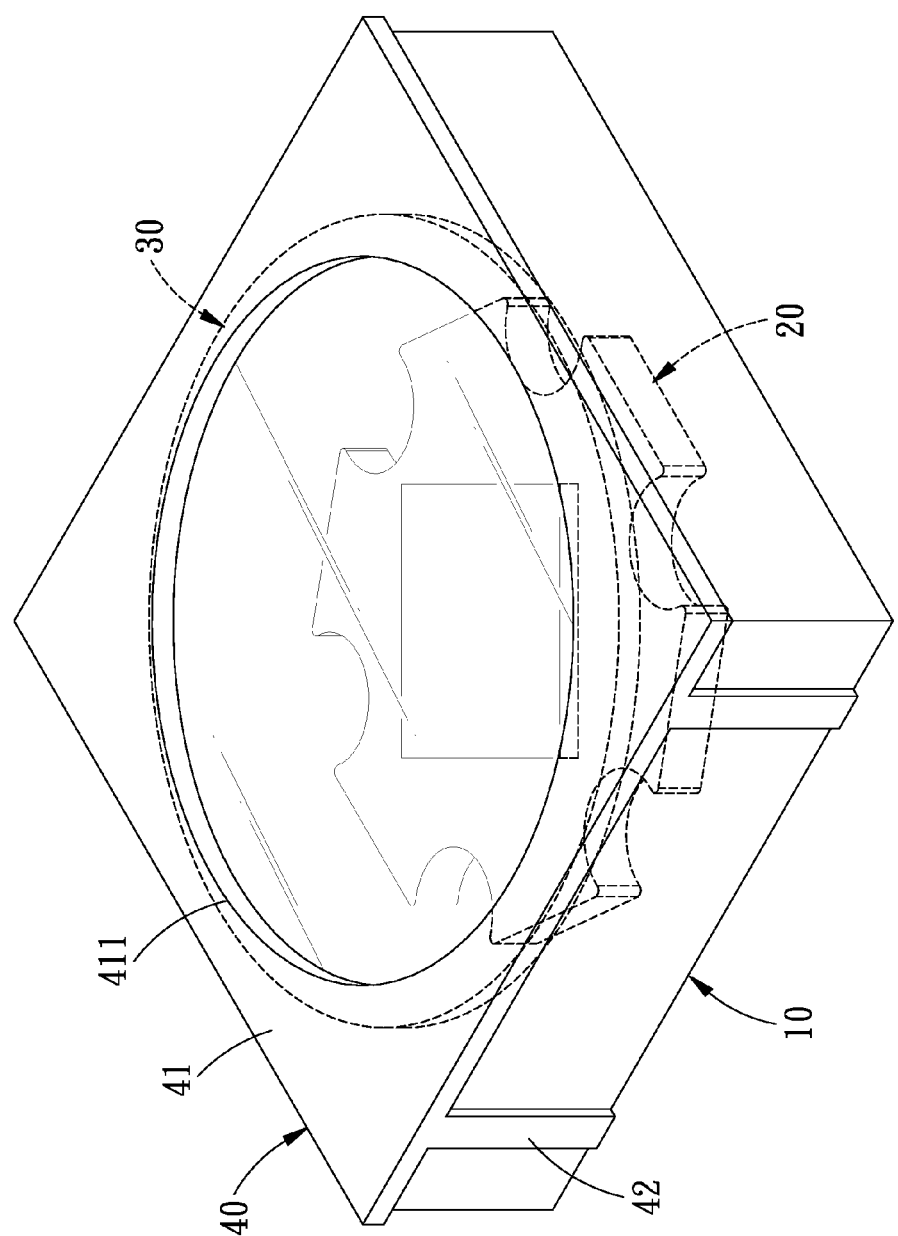
FIG. 5 is a perspective view of the LED package module structure in accordance with another embodiment of the present invention.

Furthermore, another embodiment of the present invention is shown in FIGS. 4 and 5, wherein the outer surface 122 of the peripheral wall 12 of the reflection cup 10 is square-shaped, the inner surface of the respective positioning legs 42 of the stationary package 40 is flat, and the bottom 11 of the reflection cup 10 is formed with a plurality of cavities 16. When the press portion 41 of the stationary package 40 is pressed against the light transmitting color conversion member 30, the stop portions 421 of the positioning legs 42 can be engaged in the cavities 16, so that the stationary package 40 and the reflection cup 10 are stably assembled together to fix the light transmitting color conversion member 30.

While we have shown and described various embodiments in accordance with the present invention, it is clear to those skilled in the art that further embodiments may be made without departing from the scope of the present invention.

What is claimed is:

1. A light emitting diode package module structure comprising:
    a reflection cup including a bottom, a peripheral wall connected to the bottom, and a receiving chamber defined by the bottom and the peripheral wall, the peripheral wall having an outer surface and an inner surface, the inner surface of the peripheral wall facing the receiving chamber, and a thickness of the reflection cup from the opening to the outer surface being D1;
    a light emitting diode module received in the receiving chamber of the reflection cup;
    a light transmitting color conversion member; and
    a stationary package including a press portion and at least two positioning legs connected to the press portion, the press portion being a hollow structure with a hole and having a thickness D2 which is measured from an outer periphery of the press portion to the hole, D2>D1, the respective positioning legs having one end connected to the press portion, another end of the respective positioning legs being formed with a stop portion, the stationary package being sleeved on the reflection cup in such a manner that the press portion is pressed against the light transmitting color conversion member, and the stop portions of the positioning legs are positioned against the bottom of the reflection cup;
    wherein the reflection cup is formed on the inner surface thereof with a conical light reflection surface, the bottom of the reflection cup is formed with a plurality of cavities for reception of the stop portions of the positioning legs, the positioning legs are elastic, and between a top edge of the peripheral wall and the bottom of the reflection cup is formed an annular surface which is a shoulder portion lower than the top edge of the peripheral wall, and the light transmitting color conversion member is positioned against the annular surface.

2. The light emitting diode package module structure as claimed in claim 1, wherein the light transmitting color conversion member is a coated or fluorescent glass.

3. The light emitting diode package module structure as claimed in claim 1, wherein the outer surface of the peripheral wall of the reflection cup is a circumferential surface, the press portion is a circular structure, and the respective positioning legs have an inner surface arch-shaped to fit a shape of the outer surface of the peripheral wall of the reflection cup.

4. The light emitting diode package module structure as claimed in claim 1, wherein the outer surface of the peripheral wall of the reflection cup is square-shaped, and an inner surface of the respective positioning legs of the stationary package is flat.

5. The light emitting diode package module structure as claimed in claim 1, wherein the stationary package is made of metal.

6. The light emitting diode package module structure as claimed in claim 1, wherein the light transmitting color conversion member is formed to fit the shape of the annular surface of the reflection cup.

* * * * *